United States Patent
Chen (10) Patent No.: US 10,737,622 B1
(45) Date of Patent: Aug. 11, 2020

(54) KIND OF VEHICLE-MOUNTED INTELLIGENT INFANT REARVIEW MIRROR

(71) Applicant: Ningbo Quanchengruijing Electronics Co., Ltd., Ningbo, Zhejiang (CN)

(72) Inventor: Guirui Chen, Guangdong (CN)

(73) Assignee: NINGBO QUANCHENGRUIJING ELECTRONICS CO., LTD., Ningbo Zhejiang (CN)

( * ) Notice: Subject to any disclaimer, the term of this patent is extended or adjusted under 35 U.S.C. 154(b) by 0 days.

(21) Appl. No.: 16/707,475

(22) Filed: Dec. 9, 2019

(51) Int. Cl.

| | |
|---|---|
| *B60R 1/00* | (2006.01) |
| *B60R 16/033* | (2006.01) |
| *H05K 7/14* | (2006.01) |
| *H05B 45/10* | (2020.01) |
| *H05B 47/19* | (2020.01) |
| *H05B 47/115* | (2020.01) |
| *B60Q 3/258* | (2017.01) |
| *B60R 1/12* | (2006.01) |
| *B60Q 3/80* | (2017.01) |
| *H05K 1/18* | (2006.01) |

(52) U.S. Cl.
CPC .............. *B60R 1/008* (2013.01); *B60Q 3/258* (2017.02); *B60Q 3/80* (2017.02); *B60R 1/1207* (2013.01); *B60R 16/033* (2013.01); *H05B 45/10* (2020.01); *H05B 47/115* (2020.01); *H05B 47/19* (2020.01); *H05K 1/181* (2013.01); *H05K 7/1427* (2013.01); *B60Q 2900/30* (2013.01); *B60R 2300/8013* (2013.01); *H05K 2201/10037* (2013.01); *H05K 2201/10053* (2013.01); *H05K 2201/10113* (2013.01)

(58) Field of Classification Search
CPC ...... B60Q 3/258; B60Q 3/80; B60Q 2900/30; B60R 1/008; B60R 16/033; B60R 1/1207; B60R 2300/8013; H05B 47/19; H05B 47/115; H05B 47/10; H05B 45/10; H05K 1/181; H05K 7/1427
USPC ......................................... 359/841, 843, 844
See application file for complete search history.

(56) References Cited

U.S. PATENT DOCUMENTS

| | | | | |
|---|---|---|---|---|
| 5,267,090 A | * | 11/1993 | Dowd ................... | B60J 3/0282 296/97.5 |
| 6,124,886 A | * | 9/2000 | DeLine ................ | B60Q 1/2665 348/148 |
| 6,428,172 B1 | * | 8/2002 | Hutzel ..................... | B60R 1/12 359/265 |

(Continued)

*Primary Examiner* — Amy Cohen Johnson
*Assistant Examiner* — Syed M Kaiser
(74) *Attorney, Agent, or Firm* — Muncy, Geissler, Olds & Lowe, P.C.

(57) ABSTRACT

A kind of vehicle-mounted intelligent infant rearview mirror contains: upper cover body, lower cover body, ribbon seat upper cover and ribbon seat lower cover. The upper cover body is fastened on the lower cover body, the edge position of lower cover body is equipped with the fixed hole on all sides in symmetry, the upper cover body is fixed with the stud corresponding to the fixed hole of the lower cover body, the upper cover body and lower cover body are fixed and connected by round head self-tapping screw, the upper cover body is equipped with the convex groove matched with the translucent piece, the groove is equipped with the limit slot, the limit slot is embedded with PCB lamp panel, and the upper cover body and the acrylic wide angle lens are pressed together.

8 Claims, 4 Drawing Sheets

(56) References Cited

U.S. PATENT DOCUMENTS

| | | | | |
|---|---|---|---|---|
| 2002/0003571 | A1* | 1/2002 | Schofield | B60R 11/0235 348/148 |
| 2002/0032510 | A1* | 3/2002 | Turnbull | H04R 1/08 701/49 |
| 2002/0159270 | A1* | 10/2002 | Lynam | B60R 1/00 362/492 |
| 2003/0086191 | A1* | 5/2003 | Nielsen | B60R 1/078 359/877 |
| 2003/0117728 | A1* | 6/2003 | Hutzel | H04N 7/181 359/838 |
| 2003/0169522 | A1* | 9/2003 | Schofield | H04N 5/23238 359/876 |
| 2006/0255960 | A1* | 11/2006 | Uken | G02F 1/157 340/815.4 |
| 2009/0295181 | A1* | 12/2009 | Lawlor | B60R 11/04 296/1.11 |
| 2014/0293169 | A1* | 10/2014 | Uken | B60R 1/12 349/12 |
| 2016/0264054 | A1* | 9/2016 | Uken | G06F 3/04883 |

* cited by examiner

KIND OF VEHICLE-MOUNTED INTELLIGENT INFANT REARVIEW MIRROR

TECHNICAL FIELDS

The invention involves the automobile supplies technical field, especially a kind of infant rearview mirror.

BACKGROUND TECHNOLOGY

In order to facilitate drivers to observe the children at backseats in travel driving and to prevent the children from the accident, a kind of infant rearview mirror occurs at the market and is specially installed in automobile.

However, most of infant rearview mirrors doesn't have the light function at present, only individual same kinds of products have the light function. The infant rearview mirrors without light function aren't conducive to observing the babies during night driving due to darker light in the car. While few infant rearview mirrors with light effect are equipped with LED lamp bead on both sides which gives out light and directly shines on the rear seats. Drivers generate glare easily in the observation of infant rearview mirror, as a result, eyes can't adapt to the surrounding brightness immediately from the strong light to dark light and the traffic hidden trouble exists. Besides, babies would be shielded by the backrest of front seats due to small figure when sitting at rear seats. As a result, drivers can't observe babies from the infant rearview mirror and master babies' status completely.

INVENTION CONTENT

The invention aims to provide a kind of intelligent infant rearview mirror in order to solve the glare or dead angle easily generated in drivers' observation through the infant rearview mirror as well as the sight blockage of drivers.

Based on the following technical scheme, the invention aims to achieve: a kind of vehicle-mounted intelligent infant rearview mirror contains: upper cover body, lower cover body, ribbon seat upper cover and ribbon seat lower cover; the upper cover body is fastened on the lower cover body, the edge position of lower cover body is equipped with the fixed hole on all sides in symmetry, the lower cover body edge is fixed with the card edge matched with the upper cover body, the upper cover body is fixed with the stud corresponding to the fixed hole on lower cover body, and the upper cover body and lower cover body are fixed and connected by round head self-tapping screw II;

the inside of lower edge of upper cover body is equipped with the convex groove matched with translucent piece, the groove is equipped with the limit groove, the limit groove is embedded with PCB lamp panel, the periphery of the upper cover body is equipped with the protruding edge with width of 3-5 mm, and the upper cover body and the acrylic wide angle lens are pressed together;

the lower cover body includes the battery jar, circuit control panel and mounting groove, the middle of lower cover body is equipped with the battery jar, the battery jar front end over lower cover body is fixed with mounting groove, the mounting groove is inserted with the round head ball arm, and the round head ball arm and rubber blanket casting die conduct coordination. The rubber blanket casting die directly contacts the spring casting die, the rubber blanket is assembled between the round head ball arm and rubber blanket casting die, and the rubber blanket directly covers the round head ball arm;

the outer ring of mounting groove is fixed with the fixed groove shell, the mounting groove is equipped with the key groove, the key groove and rubber blanket casting die are fixed with the convex key for coordination, four studs are fixed between the fixed groove shell and mounting groove, the stud coordinates with the screw hole evenly set on spring casting die, and the connection position of the stud and screw hole is fixed by round head self-tapping screw I.

The battery jar is equipped with clamping piece groove, the battery spring clamping piece is embedded in the clamping piece groove, and the battery protection cover is fastened at the bottom of battery jar.

The reverse side of the circuit control panel is equipped with the toggle switch which is located in fixed groove of lower cover body, the circuit control panel and lower cover body are fixed and connected through round head self-tapping screw IV, and the circuit control panel and remote controller are connected through wireless signal.

As a kind of optimized technical solution: the top of rubber blanket casting die is equipped with the spring limit groove, the central position of rubber blanket casting die is equipped with the convex column, the convex column keeps flat with the upper end face of the rubber blanket casting die, and the spring limit convex groove is inlaid with spring.

As a kind of optimized technical solution: the bottom of round head ball arm contains the step, and the end face of round head ball arm contains the screw hole. The central position of ribbon seat upper cover contains the through-hole, and the through-hole has the same shaft center with the screw hold on the end face of round head ball arm. The ribbon seat upper cover connects the lower cover body and ribbon seat upper cover with fixed screw. The bottom of ribbon seat upper cover contains the fixed bolt hole, the upper end face of ribbon seat lower cover is fixed with the stud, the ribbon seat lower cover is fastened on the ribbon seat upper cover, and the ribbon seat upper cover and ribbon seat lower cover are connected through round head self-tapping screw III.

As a kind of optimized technical solution: the circuit control panel and anode and cathode of the battery spring clamping piece are welded at their corresponding anode and cathode point through two power lines;

the circuit control panel and PCB lamp panel are connected through the power line, one end of the power line is fixed and welded with the power output welding spot of the circuit control panel, and the other end of the power line is fixed and welded with the power receiving welding spot of PCB lamp panel.

As a kind of optimized technical solution: the circuit control panel mainly consists of the wireless receiving module, main control module, automobile motion detection module and lighting LED dimming module which are connected through internal copper wire of circuit control panel.

As a kind of optimized technical solution: the wireless receiving module on the circuit control panel and the wireless transmitting module on the remote controller are connected and transmitted through wireless signal.

As a kind of optimized technical solution: the remote controller includes the upper cover, key, rebound sponge, PCB circuit board A, lower cover, battery clamping piece A, round head self-tapping screw IX, battery protection cover A, power-on indictor lamp, electrical component and key switch;

the key is installed in rectangular groove of upper cover, the rebound sponge is directly fastened in the groove at the bottom of key, the upper cover and lower cover are fixed and connected through round head self-tapping screw IX, the bottom surface of lower cover is installed with the battery protection cover A, and the battery protection cover A and lower cover are connected by clamping;

the bottom of lower cover is equipped with battery jar, the battery clamping piece A is installed in the battery jar, the pins is fixed on the battery clamping piece A, the battery clamping piece A is installed in the pins opening on lower cover, the PCB circuit board A is coordinated on the lower cover, and the PCB circuit board A contains the pore channel corresponding to the pins opening of lower cover to coordinate the pins on battery clamping piece A.

As a kind of optimized technical solution: the anode and cathode of PCB circuit board A 34 are welded with the corresponding battery clamping piece.

The electrical component mainly consists of the capacitance, resistance, key and wireless transmitting module which are connected by internal copper wire of PCB circuit board A.

Compared with the prior art, the present invention has the following excellent effects:

1. The concealed side lighting technology of LED shields the reflected light, easily seen at position of milky white translucent piece through the bang structure of upper cover structural parts. This kind of lighting system wouldn't make drivers feel dazzling, and the drivers can see the infant image in the rearview mirror clearly, which improves the security of driving greatly. In the meantime, the lighting light wouldn't influence the sleep of infants due to weak strength.

2. With regard to the wireless remote control technology, drivers can switch on/off or switch the brightness of lighting LED whenever and wherever possible through the wireless remote control of remote controller without touching the infant rearview mirror.

3. With regard to the intelligent lighting LED time delay control technology, the intelligent infant rearview mirror is installed in the automobile motion detection module. After the lighting LED is switched on, the LED will continue lighting in the motion process of automobile. The infant rearview mirror will automatically switch off the LED for energy saving 5 minutes after automobile stops motion without the manual closing.

SPECIFIC IMPLEMENTATION MODE

The present invention will be further illustrated hereinafter in conjunction with the exemplary embodiments and accompanying figures. It is important to note that the following detailed description is illustrative and aims to provide a further description of this application. Unless otherwise specified, all technical and scientific terms used herein have the same meaning as commonly understood by ordinary technical personnel in the technological field to which this application belongs.

For the convenient for description, the spatial relative term can be used here, such as "above . . . ", "over . . . ", "on the upper surface of . . . ", "above . . . ", etc. to describe the spatial location relationship between one device as shown in figure or its features and other devices or features. Spatial relative term aims to contain different orientations in usage or operation except for the orientation of device as described in figure. For example, if the device in attached figure is inverted, it is described as the device "over other devices or structures" or "above other devices or structures" before it will be positioned as the device "below other devices or structures" or "under other devices or structures". Hence, the example term "over . . . " can include "over . . . " and "below . . . ". Such device can also be positioned in other different methods (rotation for 90° or in other orientations) and the spatial relative description used here is explained correspondingly.

Now, describe the example implementation method based on the application in more detail by reference of the attached figure. However, these example implementation methods can be implemented by many different methods, and shall not be explained as the implementation method only expounded here. These implementation methods are provided to publicize the application thoroughly and completely, and to sufficiently convey these example implementation methods to the common technicians in this field. In order to see the attached figure clearly, the thickness of layer and area is expanded and the same attached figure marker is used to indicate the same device. Hence, their description will be omitted.

Figure 1:
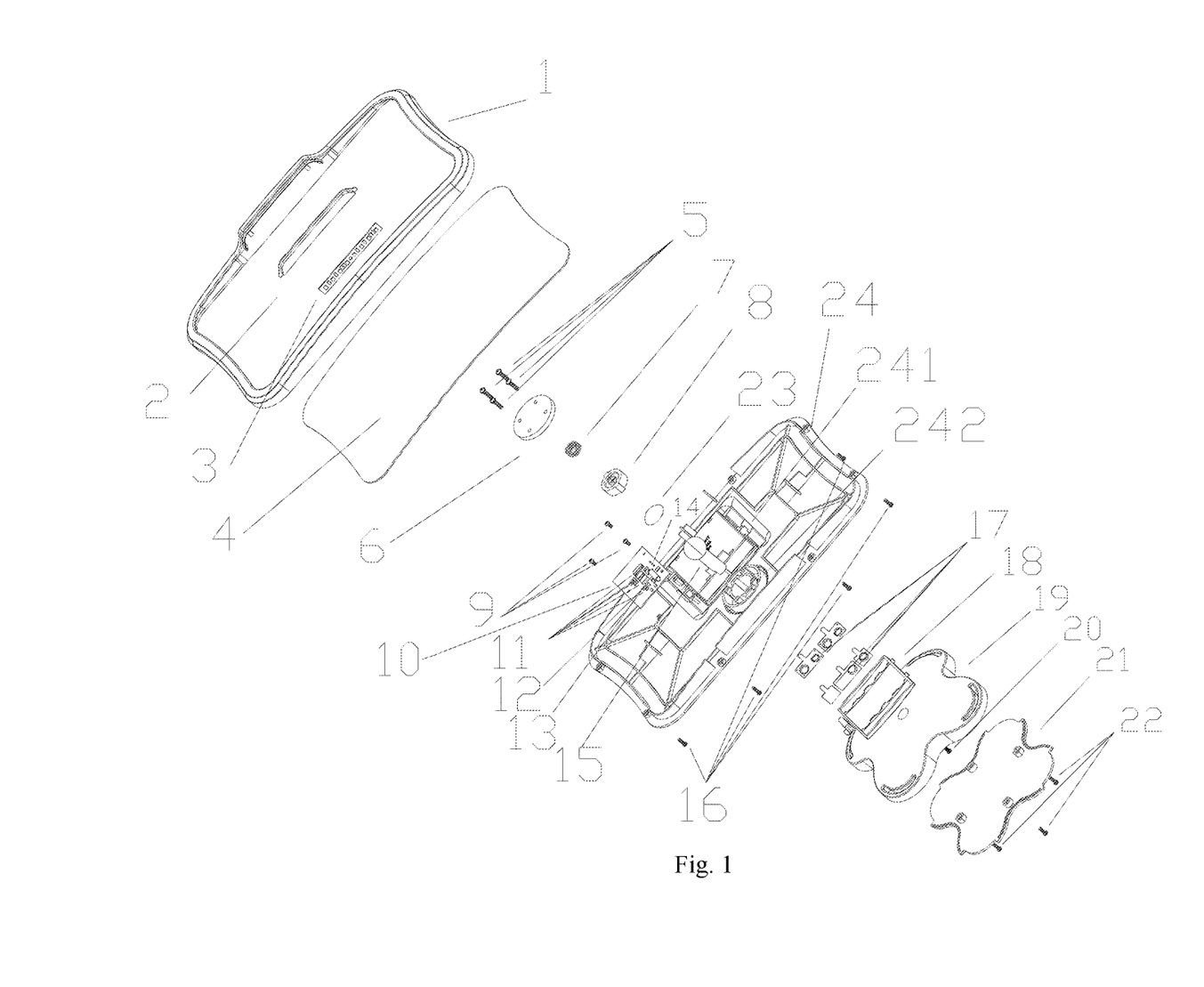
FIG. 1 shows the explosion view of the invention.

In combination with FIG. 1-6, the specific invention structure is expounded further, a kind of vehicle-mounted intelligent infant rearview mirror includes: upper cover body 1, lower cover body 24, ribbon seat upper cover 19 and ribbon seat lower cover 21;

the upper cover body 1 is fastened on the lower cover body 24, the edge position of lower cover body 24 is equipped with the fixed hole on all sides in symmetry and is fixed with the card edge matched with the upper cover body 1, the upper cover body 1 is fixed with the stud corresponding to the fixed hole on lower cover body 24, and the upper cover body 1 and lower cover body 24 are fixed and connected by round head self-tapping screw II 16;

the inside of lower edge of upper cover body 1 is equipped with the convex groove matched with translucent piece 2, the groove is equipped with the limit groove, the limit groove is embedded with PCB lamp panel 3, the periphery of the upper cover body 1 is equipped with the protruding edge with width of 3-5 mm, and the upper cover body 1 and the acrylic wide angle lens 4 are pressed together;

the lower cover body 24 includes battery jar 241, circuit control panel 10 and mounting groove 242. The middle of lower cover body 24 is equipped with the battery jar 241, the front end of battery jar 241 on the lower cover body 24 is fixed with the mounting groove 242, the mounting groove 242 is inserted with round head ball arm 15, the round head ball arm 15 coordinates with rubber blanket casting die 8, and the rubber blanket casting die 8 directly touches spring casting die 6. The rubber blanket 23 is located between round head ball arm 15 and rubber blanket casting die 8, and the rubber blanket 23 directly covers the round head ball arm 15;

the outer ring of mounting groove 242 is fixed with the fixed groove shell, the mounting groove 242 is equipped with the key groove, the key groove and rubber blanket casting die 8 are fixed with the convex key for coordination, four studs are fixed between the fixed groove shell and mounting groove 242, the stud coordinates with the screw hole evenly set on spring casting die 6, and the connection position of the stud and screw hole is fixed by round head self-tapping screw I 5.

The battery jar 241 is equipped with the clamping piece groove, the battery spring clamping piece 17 is embedded in clamping piece groove, and the battery protection cover 18 is fastened at the bottom of the battery jar 241.

The reverse side of circuit control panel 10 is equipped with the toggle switch 14 which is installed in the fixed groove of lower cover body 24, the circuit control panel 10 is fixed and connected with the lower cover body 24 through round head self-tapping screw IV 9, and the circuit control panel 10 connects remote controller through the wireless signal.

in this example, the top of rubber blanket casting die 8 is equipped with the spring limit groove, the central position of rubber blanket casting die 8 is equipped with the convex column, the convex column keeps flat with the upper end face of the rubber blanket casting die 8, and the spring limit convex groove is inlaid with spring 7.

in this example, the bottom of round head ball arm 15 is equipped with the step and the end face of round head ball arm 15 is equipped with stud, the central position of ribbon seat upper cover 19 is equipped with through-hole, the through-hole and the screw hole on the end face of round head ball arm 15 have the same shaft center, the ribbon seat upper cover 19 is connected to lower cover body 24 and round head ball arm 15 by the fixed screw 20, the bottom of ribbon seat upper cover 19 is equipped with the fixed with fixed bolt hole, the upper end face of ribbon seat lower cover 21 is fixed with stud and is fastened on the ribbon seat upper cover 19, and the ribbon seat lower cover 21 and the ribbon seat upper cover 19 are connected through round head self-tapping screw III 22.

Figure 3:
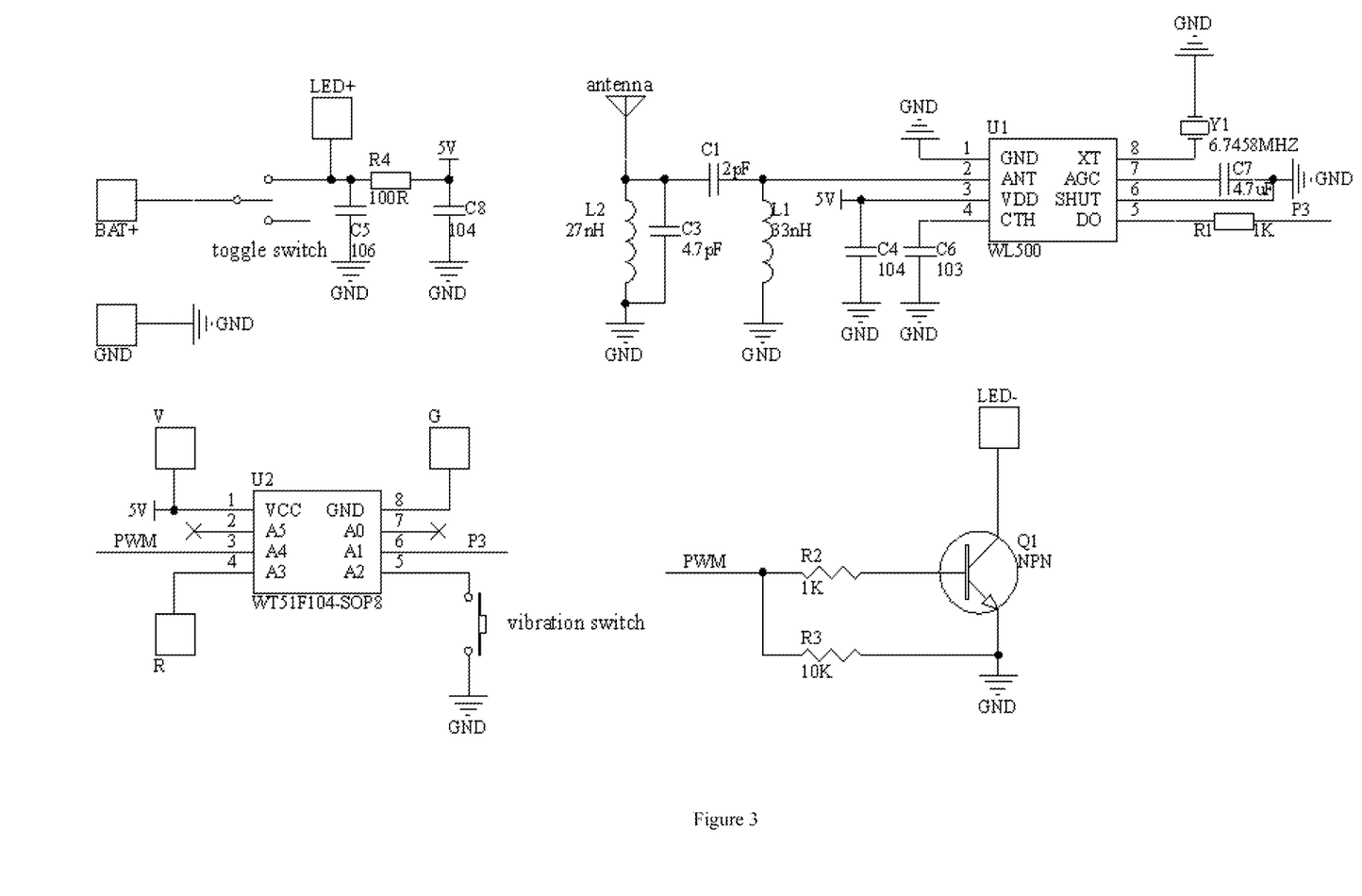
FIG. 3 shows the electricity connection drawing of the circuit control panel of the invention.

In this example, the circuit control panel 10 and anode and cathode of the battery spring clamping piece 17 are welded at their corresponding anode and cathode point through two power lines;

the circuit control panel 10 and PCB lamp panel 3 are connected through the power line, one end of the power line is fixed and welded with the power output welding spot of circuit control panel 10, and the other end of the power line is fixed and welded with the power receiving welding spot of PCB lamp panel 3.

In this example, the circuit control panel 10 mainly consists of the wireless receiving module, main control module, automobile motion detection module and lighting LED dimming module which are connected through internal copper wire of circuit control panel 10.

Figure 4:
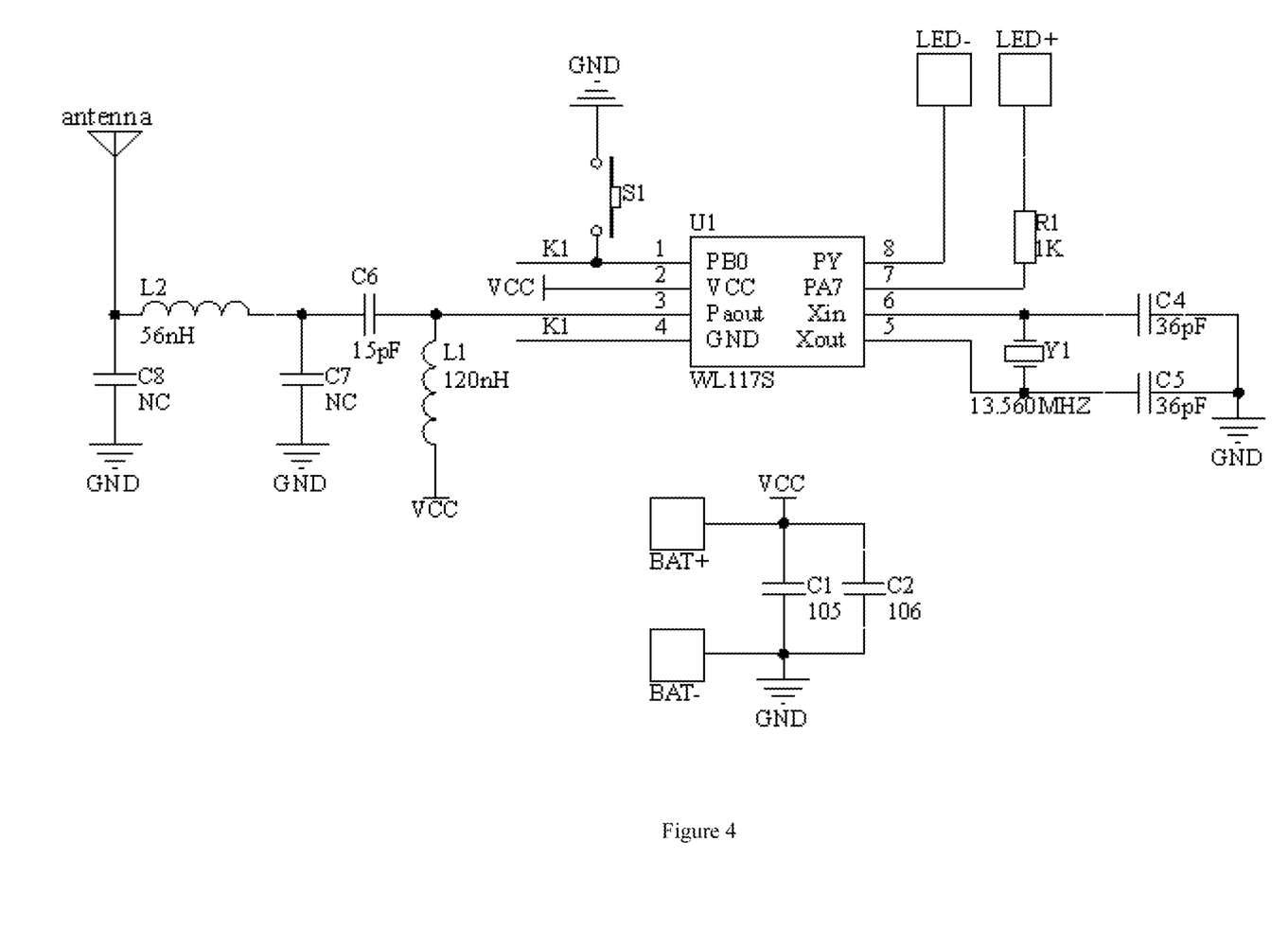
FIG. 4 shows the electricity connection drawing of the invention's remote controller.

In this example, the wireless receiving module on the circuit control panel 10 and the wireless transmitting module on the remote controller are connected and transmitted through wireless signal.

Figure 2:
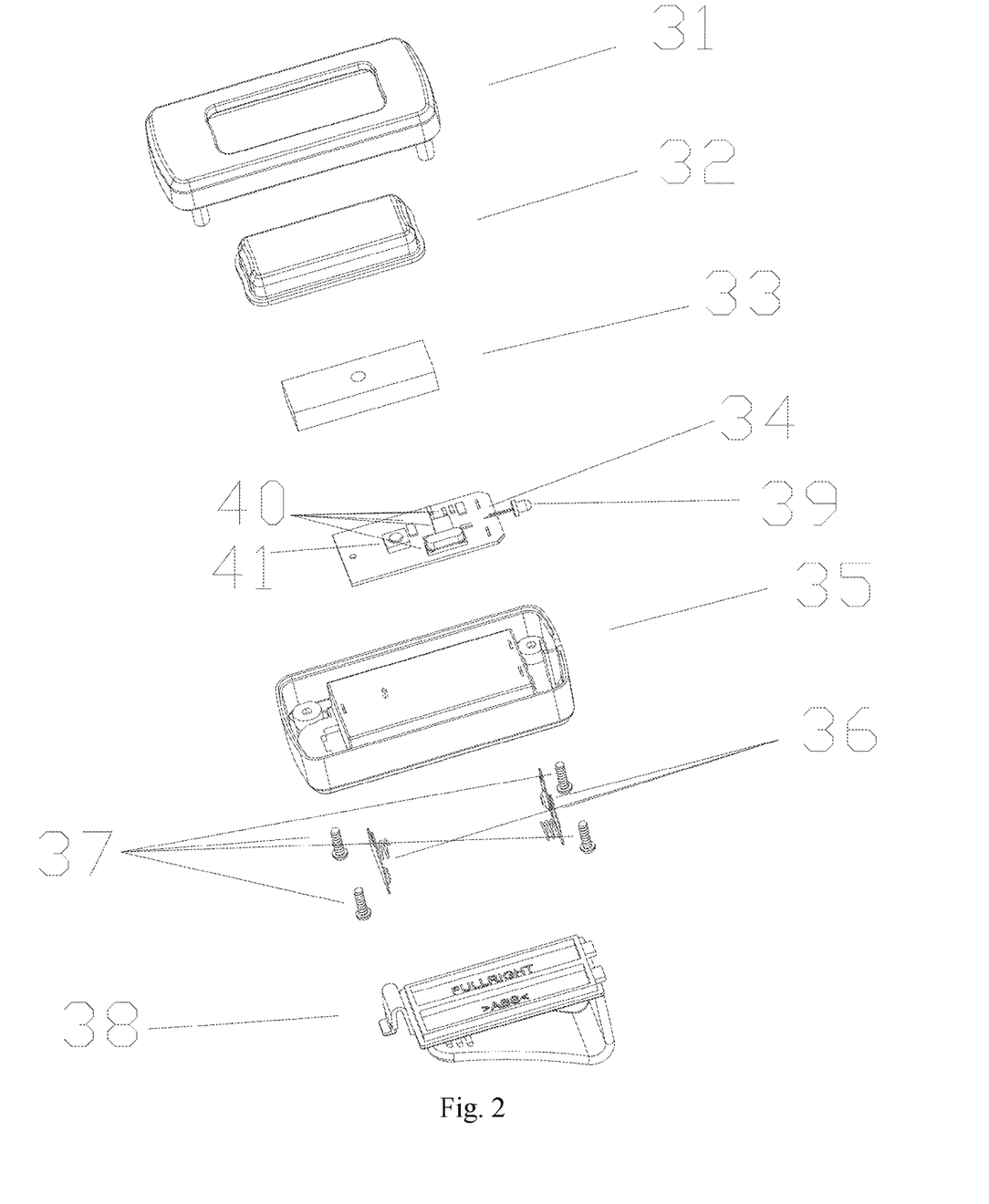
FIG. 2 shows the explosion view of the invention's remote controller.

In this example, the remote controller includes the upper cover 31, key 32, rebound sponge 33, PCB circuit board A34, lower cover 35, battery clamping piece A36, round head self-tapping screw IX37, battery protection cover A38, power-on indictor lamp 39, electrical component 40 and key switch 41;

the key 32 is installed in the rectangular groove of the upper cover 31, the rebound sponge 33 is directly fastened in the groove at the bottom of the key 32, the upper cover 31 and lower cover 35 are fixed and connected through round head self-tapping screw IX 37, the bottom surface of lower cover 35 is equipped with the battery protection cover A 38, and the battery protection cover A 38 and the lower cover 35 are connected in the clamping method;

the power-on indictor lamp 39 is located at one end of PCB circuit board A34, and the power-on indictor lamp 39 is placed in the arc groove above lower cover 35; the key switch 41 is located on PCB circuit board in convex shape, and coordinates with the circular hole opened on rebound sponge 33.

The bottom of lower cover 35 contains battery jar, the battery clamping piece A 36 is installed in the battery groove and is firmly equipped with the pins as well as is installed in pins opening on lower cover 35, the PCB circuit board A 34 coordinates the lower cover 35 and contains the pore channel corresponding to the pins opening of lower cover 35 to coordinate the pins on battery clamping piece A 36.

In this example, the anode and cathode of PCB circuit board A 34 are welded with the corresponding battery clamping piece.

The electrical component 40 mainly consists of the capacitance, resistance, key and wireless transmitting module which are connected by internal copper wire of PCB circuit board A34.

The translucent pieces are made of PC materials. The users can't see the structure component inside from outside, and the light can also transmit out from it.

When the round head ball arm is put in lower cover body for assembly, it is plugged in the mounting groove and the rubber pad is covered on the round head ball arm to increase the frictional force and resist skid. The rubber blanket casting die bottom is designed for specially fixing the rubber blanket to avoid rubber blanket sliding into the side and causing deficiency of anti-sliding. The top of rubber blanket casting die is designed the spring limit groove to fix the center force bearing point of spring and avoid the dislocation of spring upon installation of spring casting die. The spring is hit down and tightly presses the contact surface of the rubber blanket and ball arm to increase the anti-sliding effect as well as to fix angle of rearview mirror installed and fixed on the headrest of automobile backseat. 4*M3*12 threads with gasket round head self-tapping screw pass through the screw hole of spring pressure parts and are hit in 4 studs of limit fixed slot and tightly press the spring force to keep the stable stretch function.

The battery spring clamping piece is installed in special groove of battery clamping piece set in the battery jar of lower cover body and is equipped with pins used for fixation. After assembly, the pins are folded flatly in 90° for the purpose of direct fixation and of preventing the battery spring clamping piece from falling off. The circuit control panel can fix position upon installation for its reverse side is equipped with the toggle switch only by directly installing the power toggle switch in the special hole site of switch. Then the thread of 3*M2.5*5 round head self-tapping screws pass through the circuit control panel and fix the circuit control panel on the lower cover body. The circuit control panel and the anode and cathode of battery spring clamping piece are welded at their corresponding anode and cathode point through two power lines to achieve the transmission of power source. Then one end of one 13CM power line in length is welded with the power output welding spot of circuit control panel, and the other end is welded with the receiving welding spot of PCB lamp panel power to achieve the transmission of power source and control the glowing effect of light.

The infant rearview mirror is controlled by the remote controller and receives the signal from PCB circuit board wireless transmitting module in remote controller through the wireless receiving module in circuit control panel 10 of infant rearview mirror to control the infant rearview mirror as a whole.

The circuit control panel 10 in the infant rearview mirror, PCB circuit board A in the remote controller and electrical component adopt the electrical connection for control. The wireless transmitting chip WL117S in remote controller continues energizing when the key is pressed to transmit the data coding (the transmitted data are the address code of remote controller). The data are transmitted to environment through antenna at 433 MHz frequency. At this time, the indicator lamp of remote controller is normally on, and the indicator lamp remote controller is operating.

In the infant rearview mirror, the wireless receiving chip WL500 continues receiving the 433 MHz frequency data in environment through built-in antenna, decodes the data and transmits to main control chip. When the main control chip receives the correct address code of remote controller (indicating the remote controller is pressed one time), LED Gear I and LED Gear II light up and close the lighting LED. When the lighting LED is on, the main control chip would judge the automobile for motion by reading whether the vibration sensor shows data. When the automobile motion is detected, the lighting time of LED is reset as 5 minutes. If the automobile motion isn't judged within 5 minutes, the automobile is regarded to stop, then switch off the lighting LED to save energy.

It should be noted that the terms used herein is to describe the specific mode of execution, but not to impose restrictions on the exemplary mode of execution of this application. Unless otherwise expressly stated, the singular form is also intended to include the plural form. In addition, it should be understood that the terms "contain" and/or "include" used in this Instructions indicate the presence of features, steps, operations, devices, components and/or combinations of them.

What needs illustration is that the "first" and "second" as used in the Instructions and Claims of the application as well as above-mentioned in the attached figures are used to distinguish similar objects, not to describe the specific order or sequence. Data so used shall be understood as interchangeable in appropriate circumstances, so that the execution ways of this application described here can be implemented in sequences not showed in the Figures or description here.

The description above is only the preferred embodiments of the present invention but not to limit the present invention. For the technicians in this field, the present invention can have any alteration and change. Any modification, equivalent replacement and improvement made within the spirit and principle of the invention shall be included in the scope of protection of the claim of the invention.

The invention claimed is:

1. A vehicle-mounted intelligent infant rearview mirror is comprising: upper cover body, lower cover body, ribbon seat upper cover and ribbon seat lower cover;

the upper cover body is fastened on the lower cover body, an edge position of the lower cover body is equipped with the fixed hole on all sides in symmetry and is fixed with the card edge matched with the upper cover body, the upper cover body is fixed with a stud corresponding to the fixed hole on lower cover body, and the upper cover body and the lower cover body are fixed and connected by round head self-tapping screw II;

the inside of lower edge of the upper cover body is equipped with convex groove matched with translucent piece, the convex groove is equipped with a limit groove, the limit groove is embedded with PCB lamp panel, the periphery of the upper cover body is equipped with a protruding edge with width of 3-5 mm, and the upper cover body and a acrylic wide angle lens are pressed together;

the lower cover body includes battery jar, circuit control panel and mounting groove; the middle of the lower cover body is equipped with the battery jar, the front end of the battery jar on the lower cover body is fixed with the mounting groove, the mounting groove is inserted with round head ball arm, the round head ball arm coordinates with rubber blanket casting die, and the rubber blanket casting die directly touches spring casting die; a rubber blanket is located between the round head ball arm and the rubber blanket casting die, and the rubber blanket directly covers the round head ball arm;

the outer ring of the mounting groove is fixed with a fixed groove shell, the mounting groove is equipped with a key groove, the key groove and rubber blanket casting die are fixed with a convex key for coordination, four studs are fixed between the fixed groove shell and mounting groove, the stud coordinates with screw hole evenly set on the spring casting die, and the connection position of the stud and the screw hole is fixed by round head self-tapping screw I;

the battery jar is equipped with a clamping piece groove, a battery spring clamping piece is embedded in the clamping piece groove, and a battery protection cover is fastened at the bottom of the battery jar;

a reverse side of the circuit control panel is equipped with a toggle switch which is installed in the fixed groove of the lower cover body, the circuit control panel is fixed and connected with the lower cover body through round head self-tapping screw IV, and the circuit control panel connects remote controller through a wireless signal.

2. The vehicle-mounted intelligent infant rearview mirror as of claim 1, wherein the top of the rubber blanket casting die is equipped with the spring limit groove, the central position of the rubber blanket casting die is equipped with a convex column, the convex column keeps flat with the upper end face of the rubber blanket casting die, and the spring limit convex groove is inlaid with spring.

3. The vehicle-mounted intelligent infant rearview mirror as of claim 1, wherein the bottom of the round head ball arm is equipped with the step and an end face of the round head ball arm is equipped with stud, the central position of ribbon seat upper cover is equipped with through-hole, the through-hole and the screw hole on the end face of the round head ball arm have the same shaft center, the ribbon seat upper cover is connected to the lower cover body and the round head ball arm by a fixed screw, the bottom of ribbon seat upper cover is equipped with the fixed screw with fixed bolt hole, the upper end face of the ribbon seat lower cover is fixed with stud and is fastened on the ribbon seat upper cover, and the ribbon seat lower cover and the ribbon seat upper cover are connected through round head self-tapping screw III.

4. The vehicle-mounted intelligent infant rearview mirror as of claim 1, wherein the circuit control panel and anode and cathode of the battery spring clamping piece are welded at their corresponding anode and cathode point through two power lines; the circuit control panel and the PCB lamp panel are connected through the power line, one end of the power line is fixed and welded with a power output welding spot of circuit control panel, and the other end of the power line is fixed and welded with a power receiving welding spot of the PCB lamp panel.

5. The vehicle-mounted intelligent infant rearview mirror as of claim 1, wherein the circuit control panel mainly consists of a wireless receiving module, main control module, automobile motion detection module and lighting LED dimming module which are connected through internal copper wire of the circuit control panel.

6. The vehicle-mounted intelligent infant rearview mirror as of claim 5, wherein the wireless receiving module on the circuit control panel and a wireless transmitting module on the remote controller are connected and transmitted through wireless signal.

7. The vehicle-mounted intelligent infant rearview mirror as of claim 6, wherein the remote controller includes upper cover, key, rebound sponge, PCB circuit board A, lower cover, battery clamping piece A, round head self-tapping screw IX, battery protection cover A, power-on indictor lamp, electrical component and button switch;

the key is installed in the rectangular groove of the upper cover, the rebound sponge is directly fastened in the groove at the bottom of the key, the upper cover and lower cover are fixed and connected through the round head self-tapping screw IX, the bottom surface of lower cover is equipped with the battery protection cover A, and the battery protection cover A and the lower cover are connected in the clamping method;

the power-on indictor lamp is located at one end of the PCB circuit board A, and the power-on indictor lamp is placed in a arc groove above the lower cover; the key switch is located on the PCB circuit board A in convex shape, and coordinates with a circular hole opened on the rebound sponge;

the bottom of the lower cover contains battery jar, the battery clamping piece A is installed in the battery groove and is firmly equipped with the pins as well as is installed in pins opening on the lower cover, the PCB circuit board A coordinates the lower cover and contains a pore channel corresponding to the pins opening of lower cover to coordinate the pins on the battery clamping piece A.

8. The vehicle-mounted intelligent infant rearview mirror as of claim 7, wherein anode and cathode of the PCB circuit board A are welded with the corresponding battery clamping piece;

the electrical component mainly consists of the capacitance, resistance, key and the wireless transmitting module which are connected by internal copper wire of the PCB circuit board A.

* * * * *